United States Patent [19]

Colleu et al.

[11] Patent Number: 5,032,827
[45] Date of Patent: Jul. 16, 1991

[54] DEVICE FOR MONITORING A VARIABLE ELECTRIC SIGNAL AND A COMPONENT FOR SUCH A DEVICE

[75] Inventors: Rachel A. A. Colleu, Colomiers; Didier R. B. Delibes, Toulouse; Bernard L. Y. Bissey, Blagnac, all of France

[73] Assignee: Societe Nationale Industrielle et Aerospatiale, Paris, France

[21] Appl. No.: 516,180

[22] Filed: Apr. 30, 1990

[30] Foreign Application Priority Data

May 2, 1989 [FR] France .................. 89 05817

[51] Int. Cl.$^5$ .............................. G08B 21/00
[52] U.S. Cl. .................... 340/661; 340/660; 307/360
[58] Field of Search ............. 340/657, 660, 661, 662, 340/663; 307/360, 361, 362; 328/146, 147

[56] References Cited

U.S. PATENT DOCUMENTS

| | | | |
|---|---|---|---|
| 3,683,284 | 8/1972 | Mueller | 307/360 X |
| 3,882,406 | 5/1975 | Graves et al. | 371/36 |
| 4,105,900 | 8/1978 | Martin et al. | 371/14 |
| 4,613,770 | 9/1986 | Raab | 307/360 X |

FOREIGN PATENT DOCUMENTS 0007270 1/1980 European Pat. Off. .

OTHER PUBLICATIONS

*Patent Abstracts of Japan,* vol. 6, No. 70 (P-113)[948], May 6, 1982.

*Primary Examiner*—Joseph A. Orsino
*Assistant Examiner*—Jeffery A. Hofsass
*Attorney, Agent, or Firm*—Marshall, O'Toole, Gerstein, Murray & Bicknell

[57] ABSTRACT

A device is disclosed for controlling a variable electric signal. A first switch receives the monitored variable electric signal at its input. A second switch receives a first limit electrical signal for the monitored signal and a first minimum reference for the first limit electric signal. A third switch receives a second limit electric signal for the monitored signal and a second maximum limit reference for the limit electric signal. The first switch delivers at its output: the monitored signal when it is between the output signals of the second and third switches; the output signal of the second switch when the monitored signal is greater than the latter signal; and the output signal of the third switch when the monitored signal is less than the latter signal.

12 Claims, 5 Drawing Sheets

DEVICE FOR MONITORING A VARIABLE ELECTRIC SIGNAL AND A COMPONENT FOR SUCH A DEVICE

BACKGROUND OF THE INVENTION

The present invention relates to a device for monitoring a variable electric signal, as well as a component for constructing said device. Although not exclusively, the invention is particularly appropriate to the passivation of malfunctions of electric circuits on board aircraft.

For safety reasons, the orders for controlling at least certain elements of an aircraft are elaborated by at least two different devices. Thus, should there be divergence between the results given by these devices, the aircraft remains controllable by at least one of these devices during the time for confirming such divergence. If it exists beyond this confirmation time, the control system is disengaged. For this, the different signal elaboration devices may be disposed in parallel, and a signal selection system may be provided comprising a switch capable of connecting the output of one of these devices to said controlled element, under the dependence of comparators connected respectively between the outputs of said two devices. Such a selection systems with switch and comparators have the disadvantage of a certain inertia so that, if a breakdown of the device connected to the element to be controlled occurs, said element remains for a few moments connected to the malfunctioning device before being controlled by a device which has remained in operating condition. The result is a discontinuity of control which is prejudicial to piloting of the aircraft. In addition, such a system is likely to react to transitory phenomena so that it may inopportunely disconnect a working device to replace it by another; this may have disadvantages when a main signal elaboration device and auxiliary signal elaboration devices are provided and when it is desired for the element to preferably controlled by said main device.

Thus, to overcome the disadvantages of signal selection systems with switch and comparators, selection systems are preferably used, called voters, permanently receiving in parallel the outputs of said signal elaboration devices and delivering at their output that one of said signals which has the middle value with respect to the others. Thus, any discontinuity of control is avoided. However, in the case where the output signals of the signal elaboration devices are not strictly in synchronism, such a voter has the disadvantage of delivering an output signal (so controlling said controlled element) formed alternately of sections of several of said signals and not a single continuous signal chosen from the signals which are applied thereto. In addition, through their very operation, voters tend to favor the most delayed signal and so cause a delay in the control of said element. To avoid such drawbacks, faster computers could be used, but that would have other disadvantages, particularly related to weight and cost with consequential effects on the reliability.

SUMMARY OF THE INVENTION

The object of the present invention is to overcome these drawbacks. It provides a monitoring device which lets a main signal pass as long as it is considered valid.

For this, according to the invention, the device for monitoring a variable electric signal is remarkable in that it comprises:

first limitation means which receive said monitored variable electric signal at their input and whose output forms the output of said device;

second limitation means permanently receiving at their input a first limit electric signal, representative of a maximum variable value for said monitored signal and a first reference, representative of a minimum limit value for said first limit electric signal, the signal at the output of said second limitation means being either said first limit electric signal when it is greater than said first reference or said first reference when said first limit electric signal is less than said first reference;

third limitation means permanently receiving a second limit electric signal, representative of a minimum variable value for said monitored signal and a second reference, representative of a maximum limit value for said second limit electric signal, the output signal from said third limitation means being either said second limit electric signal when it is less than said second reference, or said second reference when said second limit electric signal is greater than said second reference;

said first limitation means receiving the output signals from said second and third limitation means and delivering at their output:

said monitored signal when it is between the output signals of said second and third limitation means;

the output signal of said second limitation means when said monitored signal is greater than this latter signal;

the output signal of said third limitation means when said monitored signal is less than this latter signal.

Thus, with the present invention, said variable electric signal is constantly monitored with respect to said first and second limit electric signals which are themselves limited by said first and second references. This variable electric signal cannot then exceed limit values, which are variable in a limited way. It can then be seen that the device of the invention is particularly appropriate for use in controlling elements of aircraft.

In an advantageous embodiment, said first limitation means comprise:

a first terminal for applying the output signal of said second limitation means;

a second terminal for applying the output signal of said third limitation means;

first means for comparison between said monitored variable electric signal and the output signal of said second limitation means;

second means for comparison between said monitored variable electric signal and the output signal of said third limitation means; and switching means, controllable by said first and second comparison means and connecting together:

the input and output of said first limitation means when said monitored variable electric signal is less than the output signal of said second limitation means and greater than the output signal of said third limitation means;

said first terminal and the output of said first limitation means, when said monitored variable electric signal is greater than the output signal of said second limitation means; and said second terminal and the output of said first limitation means, when said monitored variable electric signal is less than the output signal of said third limitation means.

Furthermore, said second limitation means may comprise:

a terminal for applying said first reference;
means for comparison between said first limit electric signal and said first reference; and
switching means, controllable by said comparison means and connecting together:
the input and output of said second limitation means, when said first limit electric signal is greater than said first reference;
said terminal and the output of said second limitation means, when said first limit electric signal is less than said first reference.

Similarly, said third limitation means may comprise:
a terminal for applying said second reference;
means for comparison between said second limit electric signal and said second reference; and
switching means, controllable by said comparison means and connecting together:
the input and output of said third limitation means when said second limit electric signal is less than said second reference;
said terminal and the output of said third limitation means when said second limit electric signal is greater than said second reference.

Thus, said first, second and third limitation means may have the same structure and be formed by the same component. In fact, such a component for limiting a variable electric signal is remarkable in that it comprises:

an input for said variable electric signal;
an output;
a first terminal for applying an upper limit which said variable electric signal must not exceed;
a second terminal for applying a lower limit which said variable electric signal must not exceed;
first means for comparison between said variable electric signal and said upper limit;
second means for comparison between said variable electric signal and said lower limit; and
switching means, controllable by said first and second comparison means and connecting together:
said input and said output, when said variable electric signal is less than said upper limit and greater than said lower limit;
said first terminal and said output, when said variable electric signal is greater than said upper limit; and
said second terminal and said output, when said variable electric signal is less than said lower limit.

Thus, it can be seen that this component is perfectly adapted to fulfill the functions of said first limitation means, which use all the elements of said component. On the other hand, said second and third limitation means only use part of the possibilities of said component.

In an advantageous embodiment of the device of the invention, for monitoring said electric signal as a function of a reference electric signal, from which said monitored electric signal must not deviate by more than a tolerated error, the device further comprises an adder capable of adding said tolerated error to said reference signal, as well as a subtracter capable of subtracting said tolerated error from said reference signal and the signals from said adder and said subtracter serve respectively as first and second limit electric signal. In this case, the monitored signal and the reference signal may be representative of the same magnitude or variable quantity obtained by two different channels.

It may be advantageous, from the safety point of view, to monitor said variable electric signal not using a single reference signal but two.

Thus, in a first embodiment for monitoring an electric signal as a function of two reference electric signals, from which said monitored electric signal must not deviate by more than a tolerated error, an adder and a subtracter are provided in addition for receiving either one of said reference electric signals, or the other, so that when one of said reference electric signals is applied to said adder, the subtracter receives the other of said reference electric signals and vice versa, and capable respectively of forming the sum of and the difference between said reference electric signal received and said tolerated error and the signals from said adder and said subtracter serve respectively as first and second limit electric signal.

Preferably, a switch addresses to said adder and to said subtracter said reference electric signal, depending on the result of the comparison between said reference electric signals.

Moreover, a second embodiment for monitoring an electric signal as a function of two reference electric signals, from which said monitored electric signal must not deviate by more than respective tolerated errors, is remarkable in that, for each reference signal, it comprises an adder and a subtracter so as to form respectively the sum of and the difference between said reference signal and the corresponding tolerated error, in that a first switch is disposed at the output of the two adders so as to form said first limit electric signal from one or the other of said sums and in that a second switch is disposed at the output of the two subtracters for forming said second limit electric signal from one or other of said differences.

Advantageously, said first switch is controlled by the result of the comparison between said sums, whereas said second switch is controlled by the result of the comparison between said differences. Here again, said monitored electric signal and said reference electric signals may be representative of the same magnitude.

BRIEF DESCRIPTION OF THE DRAWINGS

The figures of the accompanying drawings will better show how the invention may be put into practice. In these figures, identical references designate similar elements.

DESCRIPTION OF THE PREFERRED EMBODIMENTS

Figure 1:
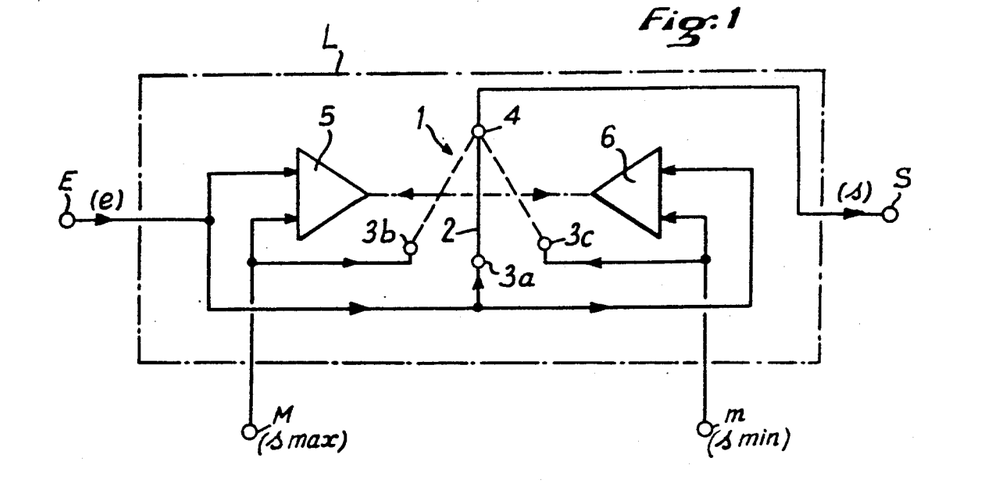
FIG. 1 is a functional schematic view of a limiter according to present invention.

Limiter L, shown schematically in FIG. 1, is intended to form a basic component for the signal monitoring device according to the present invention. In this Figure, limitation means L is shown schematically by the functions that it provides so as to make clear its nature and operation. It is however evident that such a limiter may be formed using any appropriate technology based on semiconductors and even in software form.

Limiter L, such as shown in FIG. 1, comprises a controlled three position switch 1. The mobile member 2 of this switch is capable of connecting any one of three studs 3a, 3b, 3c to a common stud 4. This switch 1 is controlled by the signals from two comparators, bearing respectively the references 5 and 6. An input of each of comparators 5 and 6 as well as the middle stud 3a are connected to an input terminal E of limiter L. The other input of comparator 5 and stud 3b are connected to another input terminal M of limiter L. Similarly, the other input of comparator 6 and stud 3c are connected to a third input terminal m of limiter L. Finally, the output terminal S of said limiter is connected to the common stud 4 of switch 1.

To the input terminal E is applied a variable input signal e, whereas to terminals M and/or m may be applied respectively references $\overline{smax}$ and $\overline{smin}$ corresponding to maximum and minimum values which should not be exceeded by the output signal s appearing at the output terminal S.

Figure 2A:
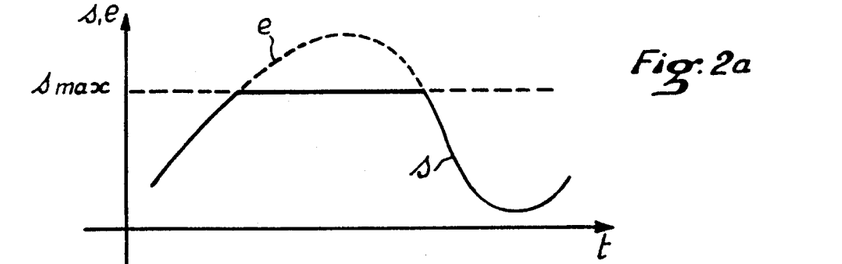
FIGS. 2a, 2b, and 2c are diagrams illustrating the operation of the limiter of FIG. 1.

Assuming that the reference $\overline{smax}$ is applied to terminal M, it can be seen that comparator 5 permanently compares the input signal e with $\overline{smax}$. As long as the input signal e is less than $\overline{smax}$, the mobile member 2 of switch 1 remains in a middle position and it is then the signal e present on stud 3a which is transmitted to the output terminal S. On the other hand, as soon as the input signal e becomes greater than $\overline{smax}$, the comparator 5 causes the mobile member 2 to switch, so that it connects together studs 3b and 4. It is therefore in this case the reference $\overline{smax}$ which is applied to the output terminal S. Thus, the output signal s is formed by the input signal e, when the latter is less than the reference $\overline{smax}$ and by this reference when the signal e is greater than the latter. This is illustrated in FIG. 2a.

Figure 2B:
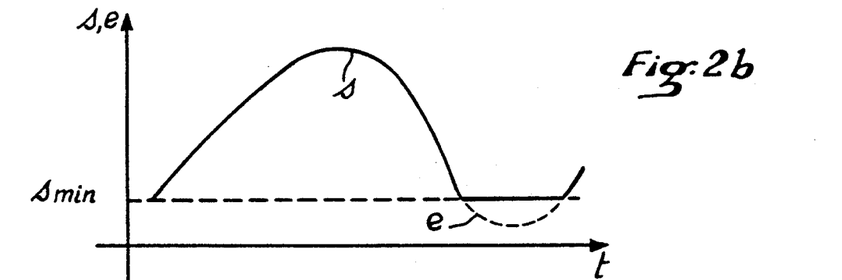

It will be readily understood that, similarly, through control of switch 1 by comparator 6, if the reference $\overline{smin}$ is applied to the terminal m, the output signal s is formed by the input signal e, when the latter is greater than the reference $\overline{smin}$ and by this reference when signal e is less than the latter, as is shown in FIG. 2b.

Figure 2C:
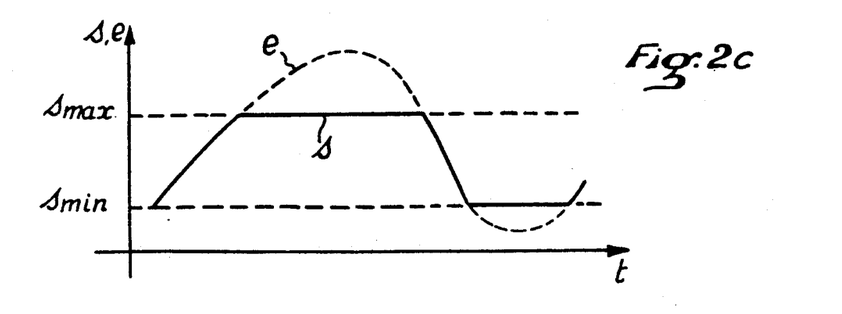

Of course, if the references $\overline{smax}$ and $\overline{smin}$ are applied simultaneously to terminals M and m, respectively, the output signal s is formed by the input signal e when the latter is between $\overline{smax}$ and $\overline{smin}$, and by these references when said signal e exceeds them respectively (see FIG. 2c).

Figure 3:
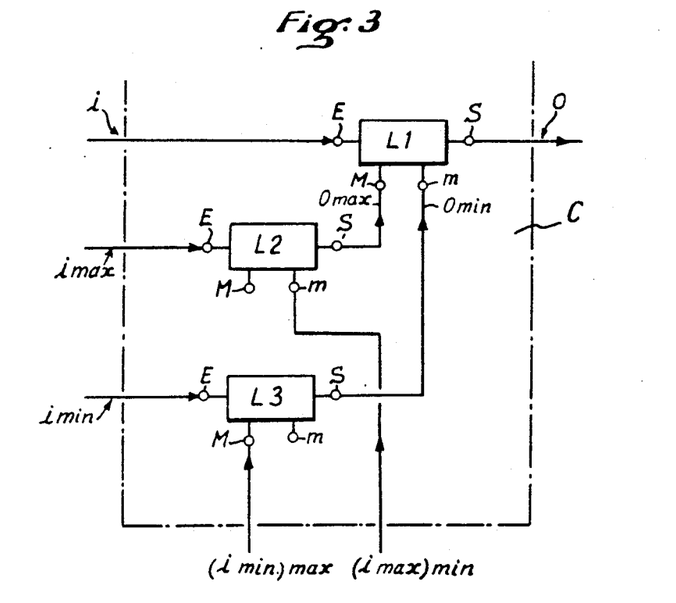
FIG. 3 is the block diagram of a signal monitoring device according to the present invention.

In FIG. 3, a signal limitation device C has been shown in accordance with the invention, formed by the combination of three limiters L1, L2 and L3, respectively identical to limiter L of FIG. 1. The input E and the output S terminals of limiter L1 form respectively the input and output terminals of device C and to terminal E of limiter L1 is applied an input signal i, for example a control signal. To the input terminals E of limiters L2 and L3 are respectively applied variable limit signals $\overline{imax}$ and $\overline{imin}$, desired for signal i. Furthermore, the output terminals S of limiters L2 and L3 are respectively connected to the terminals M and m of limiter L1. Finally, terminal M of limiter L3 and terminal m of limiter L2 are respectively connected to references $\overline{imin\ max}$ and $\overline{imax\ min}$.

By applying the operation of limiter L of FIG. 1, explained in FIGS. 2a to 2c, it can be seen that:

because of limiter L2, the signal $\overline{omax}$ applied to terminal M of limiter L1 is equal to $\overline{imax}$, if $\overline{imax}$ is greater than $\overline{imax\ min}$ and to $\overline{imax\ min}$, if $\overline{imax}$ is less than $\overline{imax\ min}$;

because of limiter L3, the signal $\overline{omin}$ applied to terminal m of limiter L1 is equal to $\overline{imin}$, if $\overline{imin}$ is less than $\overline{imin\ max}$, and to $\overline{imin\ max}$ if $\overline{imin}$ is greater than $\overline{imin\ max}$;

because of limiter L1, the signal o appearing at the output of cell C, namely at terminal S of limiter L1, is equal to signal i, if i is between $\overline{omax}$ and $\overline{omin}$ and is limited by these values, in the case of overshooting.

Figure 4A:
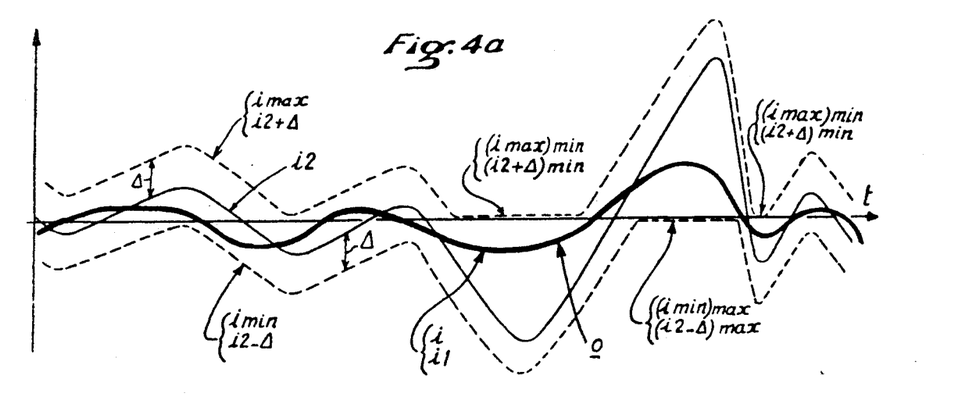
FIGS. 4a, 4b and 4c are diagrams illustrating the operation of the device of FIG. 3.
Figure 4B:
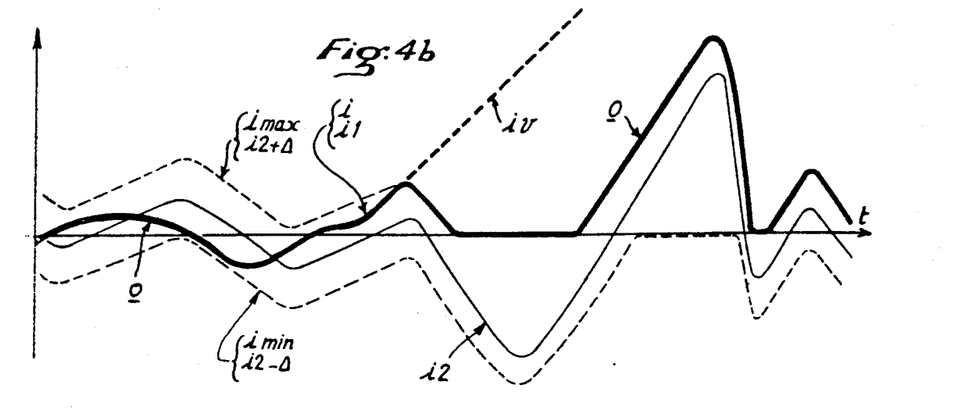
Figure 4C:
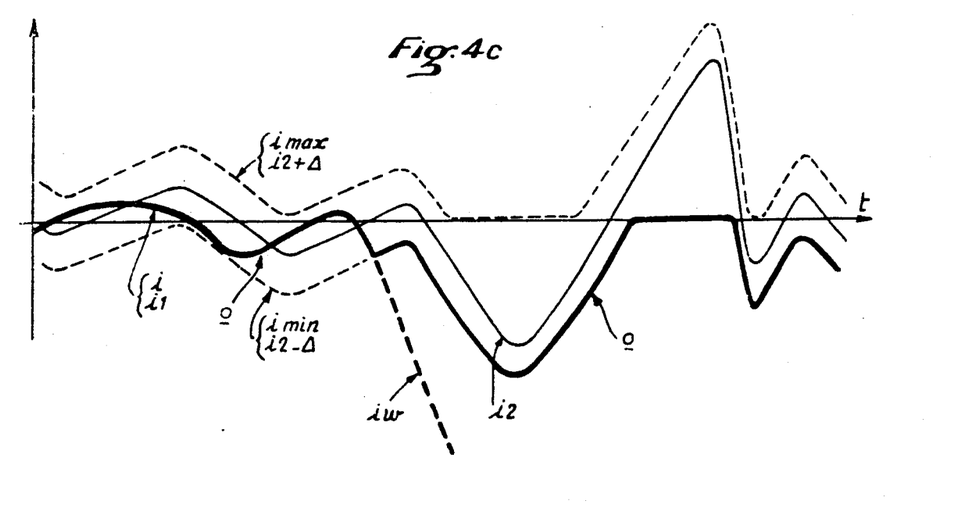

FIGS. 4a to 4c illustrate this operation of device C of FIG. 3. In these figures, the amplitudes (in ordinates) of signals i, $\overline{imax}$ and $\overline{imin}$ have been shown as a function of time t. In addition, it is assumed that the references $\overline{imax\ min}$ and $\overline{imin\ max}$ are both chosen equal to zero and that the signals $\overline{imax}$ and $\overline{imin}$ were representative of acceptable maximum and minimum values for i, for example in the way which will be explained in connection with the device of FIG. 5.

FIG. 4a shows the operation of the device of FIG. 3 in the case where signal i does not undergo abnormal variations. In this case, the signal i is limited by signals $\overline{imax}$ and $\overline{imin}$ and the output signal o is identical to signal i. It will however be noted that the signal $\overline{imax}$ cannot become less than $\overline{imax\ min}=0$ and that the signal $\overline{imin}$ cannot become greater than $\overline{imin\ max}=0$.

In FIG. 4b, we find again the limit signals $\overline{imax}$ and $\overline{imin}$ and it has been assumed that the signal i underwent a high undesirable increase (broken line leg iv) which would cause it to cross over the signal $\overline{imax}$. In this case, the output signal o (thick continuous line) is formed by the signal i, before the high undesirable increase, and by the signal $\overline{imax}$ (which may assume the value $\overline{imax\ min}$) from the latter.

FIG. 4c illustrates the opposite case in which the signal i undergoes pronounced collapse (broken line leg iw) which would cause it to cross over the signal $\overline{imin}$. The result is that the output signal (thick continuous line) is formed by the signal i before collapse and by the signal $\overline{imin}$ (which may take the value $\overline{imin\ max}$) from said collapse.

Figure 5:
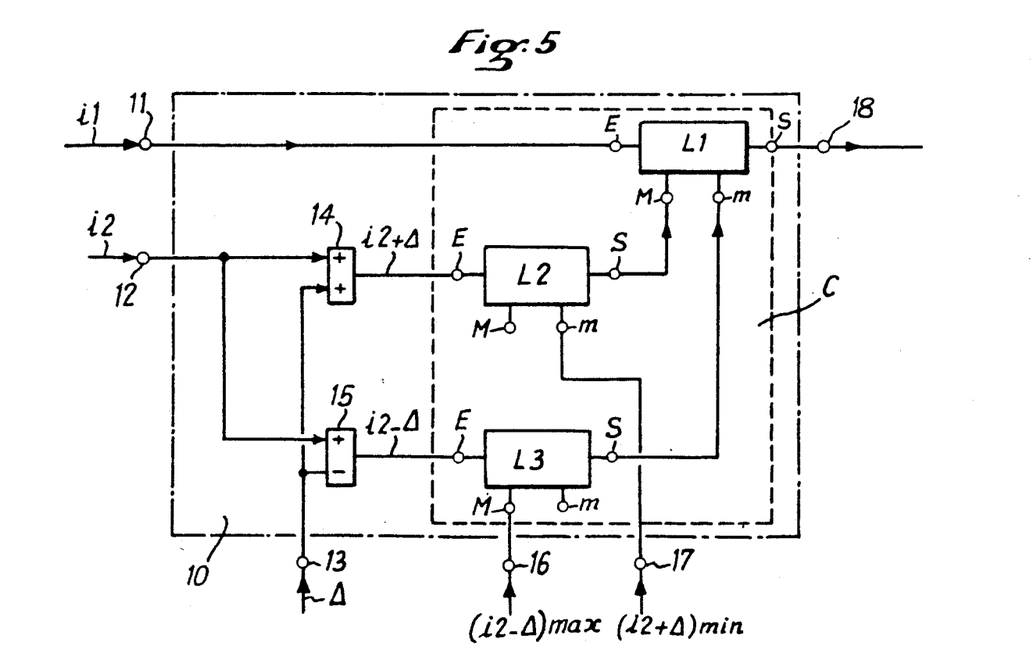
FIG. 5 shows schematically a variant of the device of FIG. 3, for monitoring a signal as a function of a reference signal.

The embodiment 10 of the device of the invention, shown in FIG. 5, comprises a device C identical to that shown in FIG. 3. This embodiment 10 is intended to monitor a signal i1 applied to its input terminal 11 (connected to the input terminal E of limiter L1) via a reference signal i2 applied to another input terminal 12, the signals i1 and i2 being for example representative of the same magnitude, but being formed by different devices, so that they are different and phase-shifted with respect to each other. At terminal 13 of system 10 is applied a reference Δ, representative of the tolerated error for the signal i1, with respect to signal i2.

Device 10 comprises an adder 14 and a subtracter 15, receiving respectively the signals i2 and from terminals 12 and 13. The output of adder 14, on which appears the signal i2+Δ, is connected to the input E of limiter L2, whereas the output of subtracter 15, on which the signal i2-Δ appears, is connected to the input E of limiter L3.

On the terminals 16 and 17 of device 10 (connected respectively to terminal M of limiter L3 and terminal m of limiter L2) are applied respectively references corresponding to maximum (i2-Δ)max and minimum (i2+Δ)min values, desired respectively for the signal i2-Δ and for the signal i2+Δ.

The output 8 of device 20 is connected to the output S of limiter L1.

By comparing the devices of FIGS. 3 and 5, it can then be seen that the signals i2+Δ and i2-Δ play respectively the role of signals imax and imin and that the limit values (i2+Δ)min and (i2-Δ)max correspond respectively to the limit values max)min/ and min)max/.

In the case of the device of FIG. 5, the validity corridor of signal i1 (comparable to signal i of FIG. 3) is therefore determined by signals obtained respectively by adding and subtracting the tolerated error Δ with respect to signal i2.

The operating diagrams of FIGS. 4a, 4b and 4c are therefore valid for the device of FIG. 5. In these diagrams, the signal i2 has been plotted and the tolerated error Δ shown.

Figure 6A:
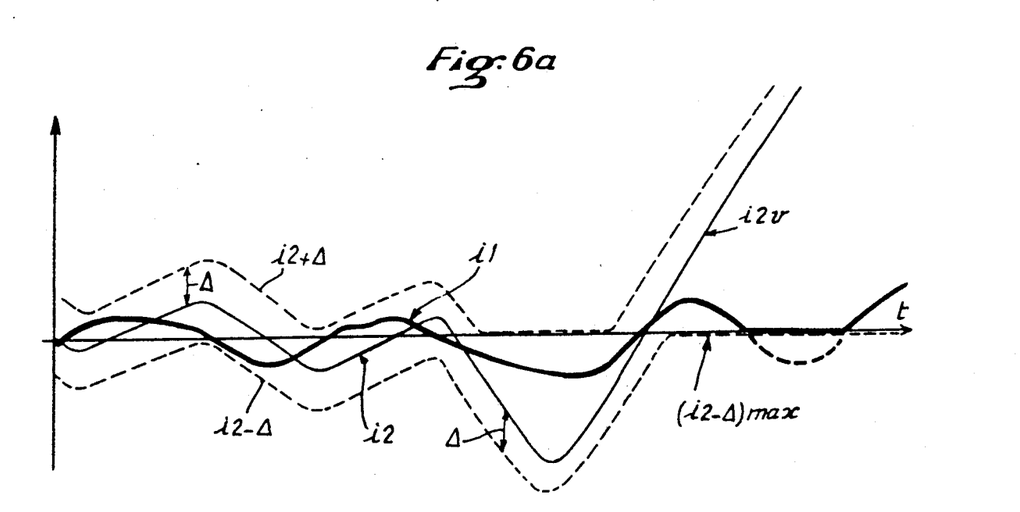
FIGS. 6a and 6b are diagrams illustrating the operation of the device of FIG. 5, should the signal for defining the variation corridor of the monitored signal drift.
Figure 6B:
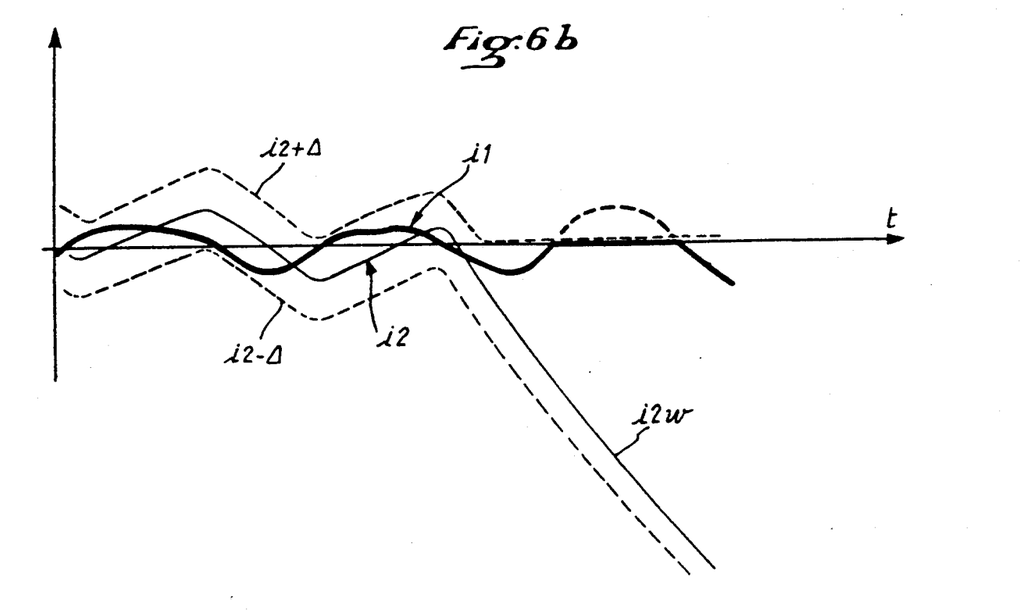

In the diagrams of FIGS. 6a and 6b, the operation of the device of FIG. 5 has been illustrated in the case of a considerable undesirable drift of the reference signal i2.

Should there be a considerable uncontrolled increase of signal i2 (see leg i2v in FIG. 6a), the signals i2+Δ and i2-Δ also increase. The signal i2+Δ is not limited in its increase by the limiter L2; on the other hand, the increase of signal i2-Δ is limited to (i2-Δ)max, (chosen equal to zero in FIG. 6a) by limiter L3. Consequently, the signal i not limited to the upper limits by limiter L1 but, on the contrary, it is limited to the value (i2-Δ)max on the lower value side. Thus, the signal o at output 18 is formed by signal i1 before the uncontrolled increase of signal i2 then, after such increase, either by the portions of said signal i1 greater than (i2-Δ)max or by (i2-Δ)max for the portions of said signal less than (i2-Δ)max (shown with broken lines in FIG. 6a).

On the contrary, in the case of a considerable uncontrolled collapse of signal i2 (see leg i2w in FIG. 6b), the signals i2+Δ and i2-Δ also decrease, but the drop of signal i2+Δ is limited to (i2+Δ)min (chosen equal to zero in FIG. 6b) by limiter L2, whereas the drop of signal i2-Δ is not limited by the limiter L3. Consequently, the signal o at output 18 is formed by the signal i1 before collapse of signal i2 then, after such collapse, either by the portions of said signal i1 less than (i2+Δ) or by (i2+Δ)min for the portions of said signal i1 greater than (i2+Δ)min (shown by broken lines in FIG. 6b).

Figure 7:
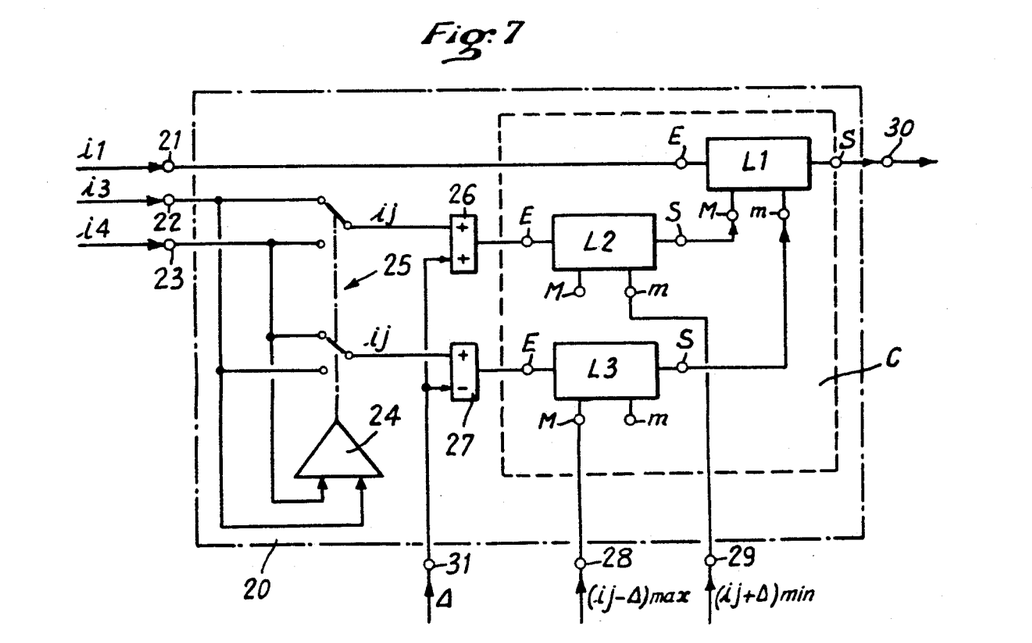
FIGS. 7 and 8 give the block diagram of two other embodiments for monitoring a signal as a function of two reference signals.

To increase the monitoring safety, it may be interesting to monitor the signal i1 not by a single signal i2 but using two signals i3 and i4. A corresponding embodiment of the invention is shown in FIG. 7.

This embodiment, bearing the reference 20, uses a device C identical to that shown in FIGS. 3 and 5. This embodiment 12 is for monitoring a signal i1 applied to its input terminal 21 (connected to the input terminal E of limiter L1) via two reference signals i3 and i4 applied respectively to two other input terminals 22 and 23, the signals i1, i3 and i4 being for example representative of the same magnitude, but being formed by different devices, so that they are different and phase-shifted with respect to each other. On a terminal 31 of system 20 is applied a reference Δ representative of the tolerated error for signal i1, with respect to signal i3 and with respect to signal i4.

The device 20 further comprises a comparator 24 receiving signals i3 and i4 and able to control a switch 25, an adder 26 and a subtracter 27. Under the dependence of comparator 24, switch 25 is capable of simultaneously addressing one of the two signals i3 or i4 to adder 26, whereas it addresses the other of these signals (i4 or i3) to the subtracter 27. For example, switch 25 addresses this signal i3 to subtracter 26 and signal i4 to subtracter 27 when i3 is greater than i4, whereas it addresses the signal i4 to adder 26 and signal i3 to subtracter 27 when i4 is greater than i3. In addition, adder 26 and subtracter 27 receive the tolerated error Δ from terminal 31.

The output of adder 26, on which appears the signal ij+Δ (with ij=i3 or ij=i4), is connected to the input E of limiter L2, whereas the output of subtracter 27, on which appears the signal ij-Δ is connected to the input E of limiter L3.

On terminals 28 and 29 of system 20 (connected respectively to terminal M of limiter L3 and to the terminal m of limiter L2) are applied respectively references (for example equal to zero), corresponding to maximum (ij-Δ)max and minimum (ij+Δ)min values, desired respectively for signal ij-Δ and for the signal ij+Δ.

The output 30 of device 20 is connected to the output S of limiter L1.

From the foregoing, it can be readily seen that the operation of device 20 of FIG. 7 is identical to that of FIG. 5, provided that i2 is replaced by i3, when i3 is greater than i4, or by i4 when i4 is greater than i3.

Figure 8:
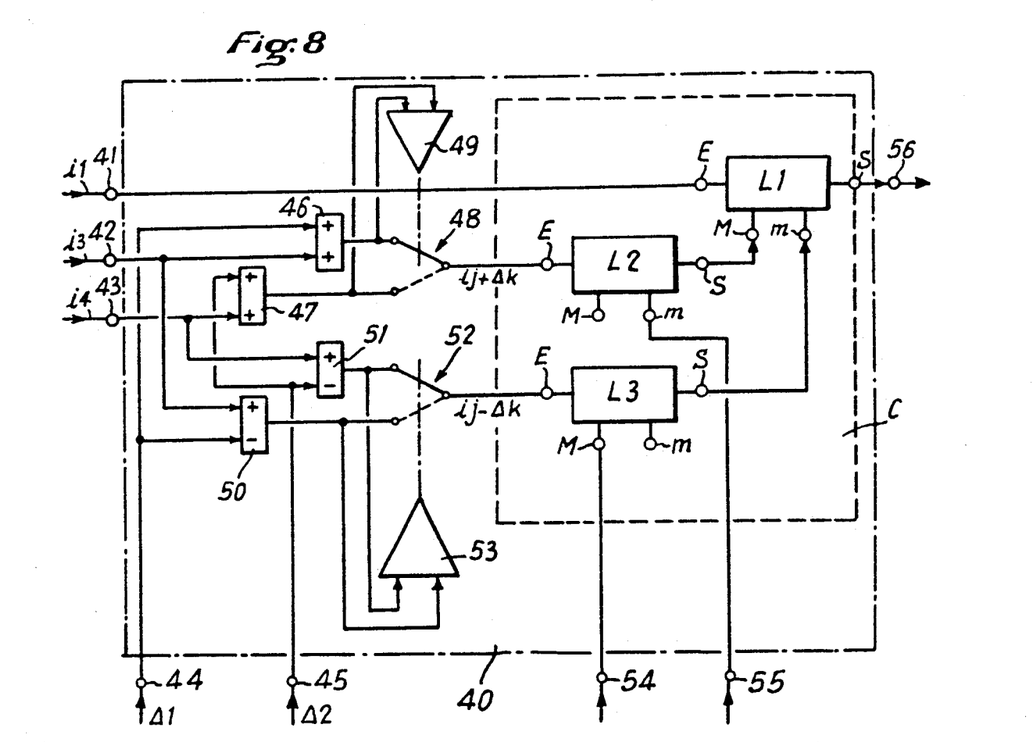

In the embodiment 40 of the device of the invention, shown in FIG. 8, we also find device C of FIGS. 3, 5 and 7. Device 40 is intended, like device 20 of FIG. 7, for monitoring a signal i1 (applied to its input terminal 41 which is connected to the input terminal E of limiter L1) via two reference signals i3 and i4, respectively applied to two other input terminals 42 and 43, the signals i1, i3 and i4 being for example representative of the same magnitude, but being formed by different channels. However, in this case, the fact is taken into account that the tolerated error Δ1 of signal i1 with respect to signal i3 may be different from the tolerated error 2 of signal i1 with respect to signal i4. Device 40 comprises two terminals 44 and 45 on which are applied respectively references representative of said tolerated errors Δ1 and Δ2.

The system 40 further comprises:
an adder 46 capable of forming the sum i3+Δ1;
an adder 47 capable of forming the sum i4+Δ2;
a switch 48 capable of connecting one or other of the outputs of said adders 46 and 47 to the input E of limiter L2;
a comparator 49 capable of controlling said switch 48 as a function of the comparison of signals i3+Δ1 and i4+Δ2;
a subtracter 50 capable of forming the difference i3-Δ1;
a subtracter 51 capable of forming the difference i4-Δ2;
a switch 52 capable of connecting one or other of the outputs of said subtracters 50 and 51 to the input E of limiter L3; and
a comparator 53 capable of controlling said switch 52 as a function of the comparison of the signals i3-Δ1 and i4-Δ2.

Comparator 49 controls switch 48 so that the limiter L2 receives that one of the two signals i3+Δ1 or i4+Δ2 which is the largest. This signal is designated hereafter by ij+Δk (with j=3 or 4 and k=1 or 2). Furthermore, comparator 53 controls p 52 so that limiter L3 receives that one of the two signals i3-Δ1 and i4-Δ2 which is the smallest (designated hereafter by ij-Δk).

On terminals 54 and 55 (connected respectively to terminal M of limiter L3 and to terminal m of limiter L2) are applied respectively references, for example equal to zero, corresponding to maximum and minimum values, desired respectively for the signal ij-Δk and for the signal ij+Δk.

The output 56 of device 40 is connected to the output S of limiter L1.

From the foregoing, it can be readily seen that the operation of device 40 of FIG. 8 is identical to that of FIG. 5, provided that i2+Δ is replaced by ij+Δk and i2-Δ by ij-Δk and to that of FIG. 7, provided that Δ1 and Δ2 are replaced by Δ.

It may be noted that device 40 is equivalent to device 10, if permanent inputs i4 and Δ2 equal to 0 are applied to this device 40.

What is claimed is:

1. A device for monitoring a variable electric signal comprising:
   first limitation means which receives said monitored variable electric signal at its input and whose output forms the output of said device;
   second limitation means permanently receiving at its input a first limit electric signal, representative of a maximum variable value for said monitored signal and a reference, representative of a minimum limit value for said first limit electric signal, the signal at the output of said second limitation means being either said first limit electric signal when it is greater than said first reference or said first reference when said first limit electric signal is less than said first reference;
   third limitation means permanently receiving a second limit electric signal, representative of a minimum variable value for said monitored signal and a second reference, representative of a maximum limit value for said second limit electric signal, the output signal from said third limitation means being either said second limit electric signal when it is less than said second reference, or said second reference when said limit electric signal is greater than said second reference;
   said first limitation means receiving the output signals from said second and third limitation means and delivering at its output:
   said monitored variable electric signal when it is between the output signals of said second and third limitation means;
   the output signal of said second limitation means when said monitored signal is greater than said output signal of said second limitation means; and
   the output signal of said third limitation means when said monitored signal is less than said output signal of said third limitation means.

2. The device as claimed in claim 1, wherein said first limitation means comprise:
   a first terminal for applying the output signal of said second limitation means;
   a second terminal for applying the output signal of said third limitation means;
   first comparator means for comparison between said monitored variable electric signal and the output signal of said second limitation means;
   second comparator means for comparison between said monitored variable electric signal and the output signal of said third limitation means; and
   switching means, controllable by said first and second comparison means and connecting together:
   the input and output of said first limitation means when said monitored variable electric signal is less than the output signal of said second limitation means and greater than the output signal of said third limitation means;
   said first terminal and the output of said first limitation means, when said monitored variable electric signal is greater than the output signal of said second limitation means; and
   said second terminal and the output of said first limitation means, when said monitored variable electric signal is less than the output signal of said third limitation means.

3. The device as claimed in claim 1, wherein said second limitation means comprise:
   a terminal for applying said first reference;
   means for comparison between said first limit electric signal and said first reference; and
   switching means, controllable by said comparison means and connecting together:
   the input and output of said second limitation means, when said first limit electric signal is greater than said first reference;
   said terminal and the output of said second limitation means, when said first limit electric signal is less than said first reference.

4. The device as claimed in claim 1, wherein said third limitation means comprise:
   a terminal for applying said second reference;
   means for comparison between said second limit electric signal and said second reference; and
   switching means, controllable by said comparison means and connecting together:
   the input and output of said third limitation means when said second limit electric signal is less than said second reference;
   said terminal and the output of said third limitation means when said second limit electric signal is greater than said second reference.

5. The device as claimed in claim 1, for monitoring an electric signal as a function of a reference electric signal, from which said monitored electric signal must not deviate by more than a tolerated error, further comprising an adder capable of adding said tolerated error to said reference signal, as well as a subtracter capable of subtracting said tolerated error from said reference signal and the signals from said adder and said subtracter serve respectively as first and second limit electric signal.

6. The device as claimed in claim 5 wherein said monitored signal and said reference electric signal are representative of the same variable quantity obtained by two different channels.

7. The device as claimed in claim 1, for monitoring an electric signal as a function of two reference electric signals, from which said monitored electric signal must not deviate by more than a tolerated error, further comprising an adder and a subtracter for receiving either one of said reference electric signals, or the other, so that when one of said reference electric signals is applied to said adder, the subtracter receives the other of said reference electric signals and vice versa, and capable respectively of forming the sum of and the difference between said reference electric signal received and said tolerated error and the signals from said adder and said subtracter serve respectively as first and second limit electric signal.

8. The device as claimed in claim 7, comprising a switch addressing to said adder and to said subtracter said reference electric signals, depending on the result of the comparison between said reference electric signals.

9. The device as claimed in claim 1 for monitoring an electric signal as a function of two reference electric signals, from which said monitored electric signal must not deviate by more than respective tolerated errors, wherein, for each reference signal, it comprises an adder and a subtracter so as to form respectively the sum of and the difference between said reference signal and the corresponding tolerated error, a first switch being disposed at the output of the two adders so as to form said first limit electric signal from one or the other of said sums and a second switch being disposed at the output of the two subtracters for forming said second limit electric signal from one or other of said differences.

10. The device as claimed in claim 9, wherein said first switch is controlled by the result of the comparison between said sums, whereas said second switch is controlled by the result of the comparison between said differences.

11. The device as claimed in claim 7, wherein said monitored electric signal and said reference electric signals are representative of the same variable quantity, but come from different channels.

12. A component for limiting a variable electric signal comprising:
   an input for said variable electric signal;
   an output;
   a first terminal for applying an upper limit which said variable electric signal must not exceed;
   a second terminal for applying a lower limit which said variable electric signal must not exceed;
   first means for comparison between said variable electric signal and said upper limit;
   second means for comparison between said variable electric signal and said lower limit; and
   switching means, controllable by said first and second comparison means and connecting together:
      said input and said output, when said variable electric signal is less than said upper limit and greater than said lower limit;
      said first terminal and said output, when said variable electric signal is greater than said upper limit; and
      said second terminal and said output, when said variable electric signal is less than said lower limit.

* * * * *